US012625183B2

(12) United States Patent　(10) Patent No.:　US 12,625,183 B2
Won　(45) Date of Patent:　May 12, 2026

(54) CIRCUIT BREAKER

(71) Applicant: LS ELECTRIC CO., LTD., Anyang-si (KR)

(72) Inventor: Dong Sun Won, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 350 days.

(21) Appl. No.: 18/283,199

(22) PCT Filed: Mar. 14, 2022

(86) PCT No.: PCT/KR2022/003540
§ 371 (c)(1),
(2) Date: Mar. 1, 2024

(87) PCT Pub. No.: WO2022/203257
PCT Pub. Date: Sep. 29, 2022

(65) Prior Publication Data
US 2025/0277854 A1　Sep. 4, 2025

(30) Foreign Application Priority Data

Mar. 26, 2021　(KR) ........................ 10-2021-0039870

(51) Int. Cl.
*G01R 31/327*　(2006.01)
*H02H 1/00*　(2006.01)
*H02H 3/02*　(2006.01)
(52) U.S. Cl.
CPC ....... *G01R 31/3274* (2013.01); *H02H 1/0061* (2013.01); *H02H 3/02* (2013.01)

(58) Field of Classification Search
CPC ..... G01R 31/3274; H02H 1/0061; H02H 3/02
See application file for complete search history.

(56) References Cited

U.S. PATENT DOCUMENTS 5,394,526 A * 2/1995 Crouse ..................... H04L 9/40
709/212
6,798,209 B2　9/2004 Lavoie et al.
(Continued)

FOREIGN PATENT DOCUMENTS

EP　　　2887482 A1　6/2015
KR　1019960008201　6/1996
(Continued)

OTHER PUBLICATIONS

Extended European Search Report for related European Application No. 22775959.4; action dated Feb. 5, 2025; (10 pages).
(Continued)

*Primary Examiner* — Scott Bauer
(74) *Attorney, Agent, or Firm* — K&L Gates LLP

(57) ABSTRACT

Embodiments of the present specification relate to a circuit breaker control device, a circuit breaker, and a circuit breaker test system, in which: communication is performed with a test device in a data communication manner so as to receive, from the test device, data on information of a test signal for testing a blocking operation of the circuit breaker; a relay element of the test signal is analyzed on the basis of the data; and whether to perform the blocking operation is determined according to an analysis result, and the blocking operation is thus performed according to a determination result.

14 Claims, 14 Drawing Sheets

(56) References Cited

U.S. PATENT DOCUMENTS

| 2003/0132753 | A1 | | 7/2003 | Lavoie et al. | |
|---|---|---|---|---|---|
| 2007/0138873 | A1 | | 6/2007 | Naumann et al. | |
| 2015/0185251 | A1 | * | 7/2015 | Heydron | H04B 7/26 |
| | | | | | 324/754.02 |
| 2015/0369846 | A1 | * | 12/2015 | Rayon | G01R 15/181 |
| | | | | | 324/126 |
| 2017/0322258 | A1 | * | 11/2017 | Miller | G06F 1/022 |

FOREIGN PATENT DOCUMENTS

| KR | 100856641 | B1 | 9/2008 |
|---|---|---|---|
| KR | 20170082540 | A | 7/2017 |
| KR | 102034894 | B1 | 10/2019 |

OTHER PUBLICATIONS

International Search Report for related International Application No. PCT/KR2022/003540; action dated Sep. 29, 2022; (2 pages).
Written Opinion for related International Application No. PCT/KR2021/017491; action dated Sep. 29, 2022; (5 pages).

* cited by examiner

CIRCUIT BREAKER

CROSS-REFERENCE TO RELATED APPLICATION

This application is a National Stage of International Application No. PCT/KR2022/003540, filed on Mar. 14, 2022, which claims priority to and the benefit of Korean Patent Application No. 10-2021-0039870, filed on Mar. 26, 2021, the disclosure of which is incorporated herein by reference in its entirety.

FIELD

The present specification relates to a circuit breaker in which the test of blocking operation is performed through a test device.

BACKGROUND

The technology underlying the present disclosure relates to a blocking operation test of a circuit breaker which is installed in a switchboard.

The reliability of the operations of an air circuit breaker (ACB) and a molded case circuit breaker (MCCB) that protect a circuit against abnormal current on the load side is increasing day by day. For example, if electricity is suddenly cut off while performing an emergency operation in a hospital, the patient undergoing surgery will be at risk of life, and if electricity is suddenly cut off in a place where many servers are operating, such as a data center, the company's economic loss will be enormous. In order to prevent such accidents, the testing and inspection of the circuit breaker is carried out, and for the inspection of the circuit breaker, work is performed after a vacation period when the usage of electricity is low in the building or the safety inspection date of the electrical equipment is notified in advance. However, performing these inspections does not guarantee the maintenance worker's leave, and the number and time of circuit breaker inspections are limited, and thus, there have been problems in that it is not possible to predict failures in advance or perform regular maintenance.

Meanwhile, in the related art, as illustrated in FIG. 1, the testing and inspection of a circuit breaker was performed in a wired manner in which the wired cable of a tester was connected to the controller (STU: Smart Trip Unit-ACB Controller) of the circuit breaker (ACB) through a connector. Specifically, as illustrated in FIG. 2a, the test is performed by connecting the cable of the tester to the analog input terminal of the circuit breaker in a wired connector manner, and applying an analog voltage signal corresponding to the current size forcibly from the tester through the wired cable. Herein, the connector includes a ground (GND) pin and consists of a plurality of pins such that an analog signal can be applied thereto. As such, due to the connector consisting of a plurality of pins, there is a risk that an electric spark may be generated when the cable is connected to the circuit breaker and the circuit breaker may erroneously trip. Further, in the case of the test method through a wired connection, more cables and connector pins are required in order to test a voltage relay as illustrated in FIG. 2b such that the implementation of a voltage relay test itself is limited by design. In addition, the conventional test method has a limitation in that only a single magnitude current is applied and only long-time, short-time, instantaneous and ground fault tests, which are current relay elements, are possible. Above all, a cable must be connected in order to perform a relay test., and particularly, connecting cables with circuit breakers in a switchboard site where overcurrent flows does not guarantee the stability of maintenance personnel, resulting in a problem that causes tremendous psychological stress to the maintenance personnel.

SUMMARY

The present specification aims to improve the limitations of the related art, and is directed to providing an exemplary embodiment that is capable of improving the limitations of the related art.

Specifically, the present specification is directed to providing an exemplary embodiment of a circuit breaker control device, a circuit breaker and a circuit breaker test system that can prevent an erroneous trip due to the application of an analog signal, when the test device for the testing and inspection of a circuit breaker is connected to the circuit breaker.

In addition, the present specification is directed to providing an exemplary embodiment of a circuit breaker control device, a circuit breaker and a circuit breaker test system that can remotely perform the testing and inspection of a circuit breaker.

In addition, the present specification is directed to providing an exemplary embodiment of a circuit breaker control device, a circuit breaker and a circuit breaker test system in which various performance tests can be performed.

In order to solve the above-described problems, the exemplary embodiment of a circuit breaker control device disclosed in the present specification includes a communication unit in which communication is performed with an external test device in a data communication manner so as to receive, from the test device, data on information of a test signal for testing a blocking operation of the circuit breaker; and a control unit in which a relay element of the test signal is analyzed on the basis of the data, and it is determined whether to perform the blocking operation according to an analysis result, and the blocking operation is thus performed according to a determination result.

In an exemplary embodiment, the communication unit may transmit a notification signal about a communication connection with the test device to the control unit when communication with the test device is established.

In an exemplary embodiment, the control unit may control the operation of the circuit breaker in a first control mode until communication is established with the test device, and when the notification signal is received from the communication unit, the first control mode may be switched to a second control mode for testing the blocking operation, and the control unit may control the operation of the circuit breaker in the second control mode.

In an exemplary embodiment, the first control mode may be a mode for receiving detection data from a detection unit included in the circuit breaker and controlling the execution of the blocking operation according to the detection data, and the second control mode may be a mode for controlling the execution of the blocking operation according to the data.

In an exemplary embodiment, the circuit breaker control device may further include a buffer unit for receiving and stabilizing the data from the communication unit and transferring the data to the control unit.

In an exemplary embodiment, after receiving the entire data from the communication unit, the buffer unit may transfer the entire data to the control unit.

In an exemplary embodiment, the control unit may determine signal information on at least one of the type, waveform, magnitude and harmonics of the test signal by using the data, and analyze the relay element by comparing the signal information with a preset relay criterion.

In an exemplary embodiment, when the signal information corresponds to the relay criterion, the control unit may determine that the circuit breaker performs the blocking operation.

Further, in order to solve the above-described problems, another exemplary embodiment of a circuit breaker test device disclosed in the present specification includes an input unit which is connected to a communication cable of an external test device; a communication unit for communicating with the test device through a wired communication manner through the input unit and receiving sampling data of a test signal for testing the blocking operation of the circuit breaker from the test device; and a control unit for analyzing relay elements of the test signal on the basis of the sampling data, determining whether to perform the blocking operation according to an analysis result, and controlling the execution of the blocking operation according to a determination result.

In an exemplary embodiment, the communication cable may be a cable for transmitting and receiving data.

In an exemplary embodiment, in the communication cable, a connector which is connected to the input unit may be formed of 4 or less pins.

In an exemplary embodiment, the communication unit may transmit a notification signal about communication connection with the test device to the control unit when communication with the test device is established.

In an exemplary embodiment, the control unit may control the operation of the circuit breaker in a first control mode until communication connection with the test device is established, and when the notification signal is received from the communication unit, the first control mode is switched to a second control mode for testing the blocking operation, and the operation control of the circuit breaker may be performed in the second control mode.

In an exemplary embodiment, the first control mode is a mode for receiving detection data from a detection unit included in the circuit breaker and controlling the execution of the blocking operation according to the detection data, and the second control mode may be a mode for controlling the execution of the blocking operation according to the sampling data.

In an exemplary embodiment, the circuit breaker test device may further include a buffer unit for receiving and stabilizing the sampling data from the communication unit and transferring the sampled data to the control unit.

In an exemplary embodiment, the buffer unit may transmit all of the sampling data to the control unit after receiving all of the sampling data from the communication unit.

In an exemplary embodiment, the control unit may determine signal information on at least one of the type, waveform, magnitude and harmonics of the test signal by using the sampling data, and compare the signal information with a predetermined relaying criterion to analyze the relaying element.

In an exemplary embodiment, the control unit may determine that the circuit breaker performs the blocking operation when the signal information corresponds to the relaying criterion.

Meanwhile, in order to solve the above-described problems, the exemplary embodiment of a circuit breaker disclosed in the present specification is installed in a switchboard, including a blocking operation unit for connecting or disconnecting a circuit between a supply side for supplying electric power and a load side for receiving the electric power; a detection unit for detecting at least one of a current and a voltage of the circuit; and a blocking control unit for determining whether to perform the blocking operation depending on a detection result of the detection unit, or communicating with an external test device in a data communication manner to receive sampling data of a test signal for testing a blocking operation of the circuit breaker from the test device, and analyzing a relay element of the test signal on the basis of the sampling data to determine whether to perform the blocking operation according to an analysis result to control the blocking operation unit according to a determination result.

In an exemplary embodiment, the blocking control unit may include a communication unit which is communicatively connected to the test device to transmit and receive data; a control unit for generating a control signal for controlling the blocking operation unit and transmitting the same to the blocking operation unit; and a buffer unit for receiving and stabilizing all of the sampling data from the communication unit and transmits the same to the control unit.

In an exemplary embodiment, the blocking control unit may be wirelessly connected to the test device to transmit and receive data.

In an exemplary embodiment, the blocking control unit may be connected to the test device by wire to transmit and receive data.

In an exemplary embodiment, the blocking control unit may be connected to the test device by wire by connecting a communication cable of the test device to the input unit.

In an exemplary embodiment, the blocking control unit may control the blocking operation unit by determining whether to perform the blocking operation according to the detection result until the communication connection with the test device is established, and when the communication connection with the test device is established, the blocking control unit may determine whether to perform the blocking operation according to the analysis result and to control the blocking operation unit.

In an exemplary embodiment, the blocking control unit may determine signal information on at least one of the type, waveform, magnitude and harmonics of the test signal by using the sampling data, and compare the signal information with a predetermined relaying criterion to analyze the relaying element.

In an exemplary embodiment, when the signal information corresponds to the relaying criterion, the blocking control unit may determine to perform the blocking operation.

Further, in order to solve the above-described problems, the exemplary embodiment of a circuit breaker test system disclosed in the present specification includes a test device for communicating with a circuit breaker through a wireless data communication manner or a wired data communication manner through a connection of a communication cable to generate sampling data of a test signal for testing a blocking operation of the circuit breaker and transmit the sampling data to the circuit breaker; and a circuit breaker for receiving the sampling data from the test device, analyzing relay elements of the test signal on the basis of the sampling data, and determining whether to perform the blocking operation according to the analysis result to operate according to a determination result.

In an exemplary embodiment, the test device may generate the sampling data by sampling the test signal at 128 [Bit].

In an exemplary embodiment, when a setting input for setting the pattern of the test signal is input, the test device may generate the test signal according to the setting input, and generate the sampling data by sampling the test signal.

In an exemplary embodiment, the setting input may be an input signal for setting at least one of the type, waveform, magnitude and harmonics of the test signal.

In an exemplary embodiment, the test device and the circuit breaker may be connected for communication wirelessly.

In an exemplary embodiment, the test device and the circuit breaker may be connected by wire by connecting a communication cable of the test device to an input unit of the circuit breaker.

In an exemplary embodiment, the circuit breaker may include a blocking operation unit for connecting or disconnecting a circuit between a supply side for supplying electric power and a load side for receiving the electric power; a detection unit for detecting at least one of a current and a voltage of the circuit; and a blocking control unit for determining whether to perform the blocking operation depending on a detection result of the detection unit, or determining whether to perform the blocking operation on the basis of the sampling data received from the test device to control the blocking operation unit according to a determination result.

In an exemplary embodiment, the blocking control unit may include a communication unit which is communicatively connected to the test device to transmit and receive data; a control unit for generating a control signal for controlling the blocking operation unit and transmitting the same to the blocking operation unit; and a buffer unit for receiving and stabilizing all of the sampling data from the communication unit and transmits the same to the control unit.

In an exemplary embodiment, the circuit breaker may receive detection data from the detection unit until communication connection with the test device is established, perform the blocking operation according to the detection data, and perform the blocking operation according to the sampling data when communication connection with the test device is established.

The exemplary embodiments of the circuit breaker control device, circuit breaker and test system of the circuit breaker disclosed in the present specification transmit data for a test signal to the circuit breaker through a data communication manner, and the circuit breaker analyzes a relay element according to the data to perform a blocking operation, and thus, they have an effect that a test check can be performed without transmission of an analog signal.

Accordingly, it is possible to prevent an erroneous trip due to the application of an analog signal when the test device and the circuit breaker are connected for testing and inspection of the circuit breaker, and it has an effect of increasing the stability and reliability of the testing and inspection.

In addition, by transmitting data about a test signal to the circuit breaker through a wireless communication manner and performing a blocking operation by analyzing a relay element according to the data, it is possible to perform testing and inspection of the circuit breaker remotely, and it also has an effect that the convenience and utility of the testing and inspection can be increased.

Moreover, by transmitting data about a test signal to the circuit breaker through the data communication manner, the circuit breaker analyzes a relay element according to the data and performs a blocking operation, and thus, it has the effects of generating test signals according to various patterns and enabling various performance tests to be performed accordingly.

BRIEF DESCRIPTION OF THE DRAWINGS

FIG. 4b is a detailed block diagram of the control device of the circuit breaker illustrated in FIG. 4a.

FIG. 5b is a detailed block diagram of the control device of the circuit breaker illustrated in FIG. 5a.

DETAILED DESCRIPTION

Figure 1:
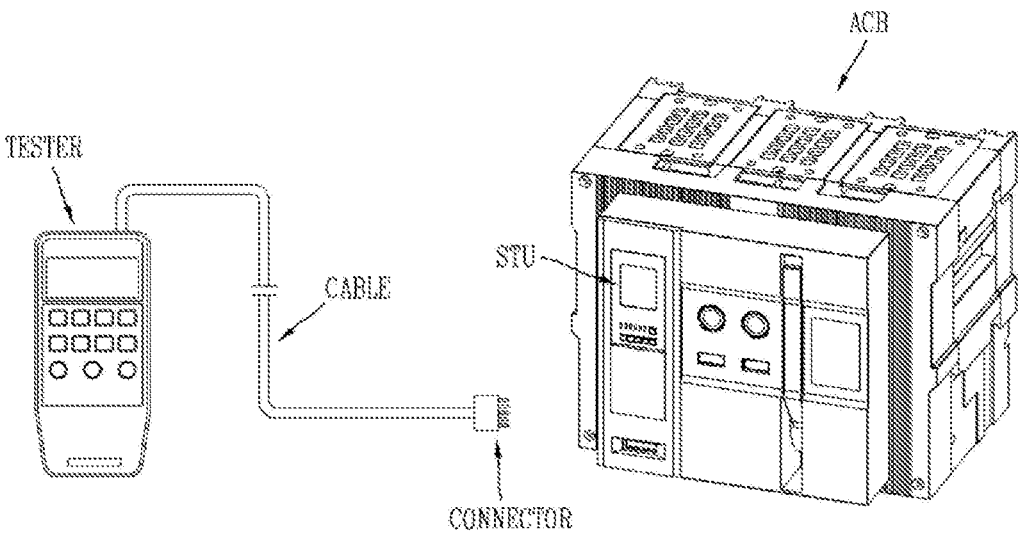
FIG. 1 is a conceptual diagram showing the testing and inspection method of a conventional circuit breaker.
Figure 2A:
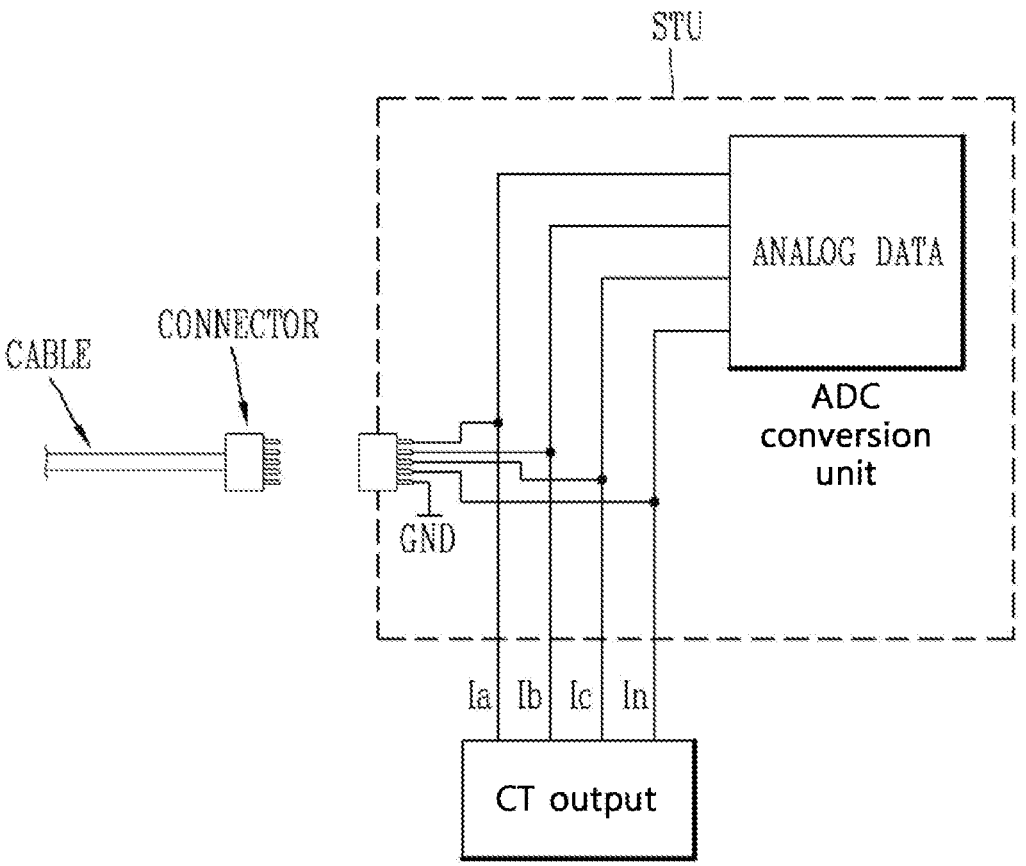
FIG. 2a is an exemplary diagram showing a current relay method according to the testing and inspection method illustrated in FIG. 1.
Figure 2B:
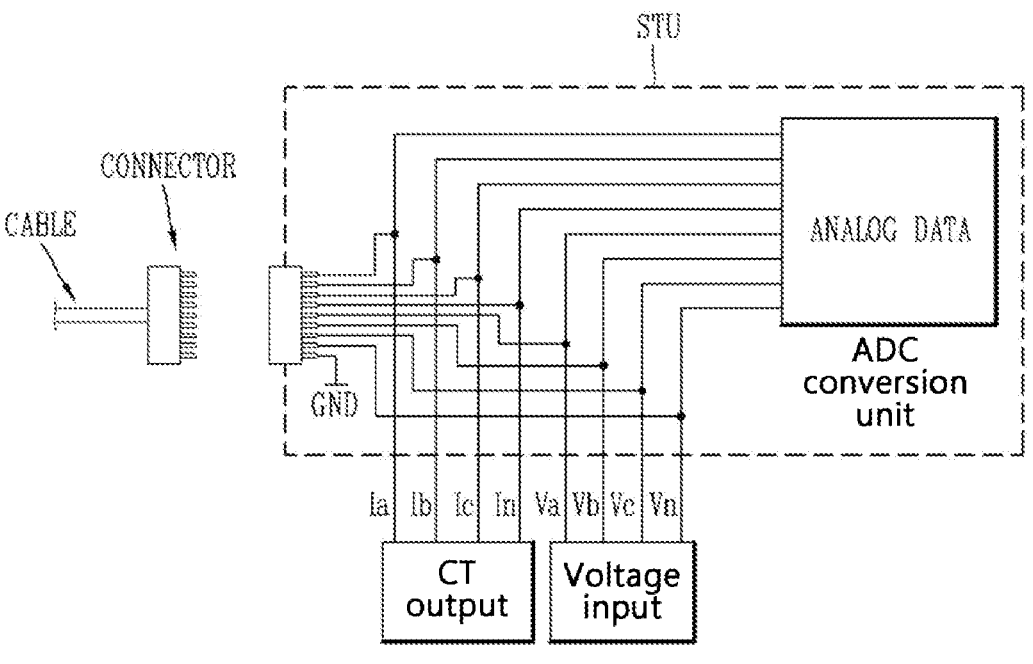
FIG. 2b is an exemplary diagram showing a voltage relay method according to the test and inspection method illustrated in FIG. 1.

Hereinafter, the exemplary embodiments disclosed in the present specification will be described in detail with reference to the accompanying drawings, but the same or similar components are assigned the same reference numerals regardless of reference numerals, and the redundant description thereof will be omitted.

Further, in terms of describing the technology disclosed in the present specification, if it is determined that the detailed description of a related known technology may obscure the gist of the technology disclosed in the present specification, the detailed description thereof will be omitted. In addition, it should be noted that the accompanying drawings are only provided for easy understanding of the spirit of the technology disclosed in the present specification, and should not be construed as limiting the spirit of the technology by the accompanying drawings.

First of all, the circuit breaker test system (hereinafter, referred to as a system) in which the blocking operation test of a circuit breaker is performed will be described.

Figure 3:
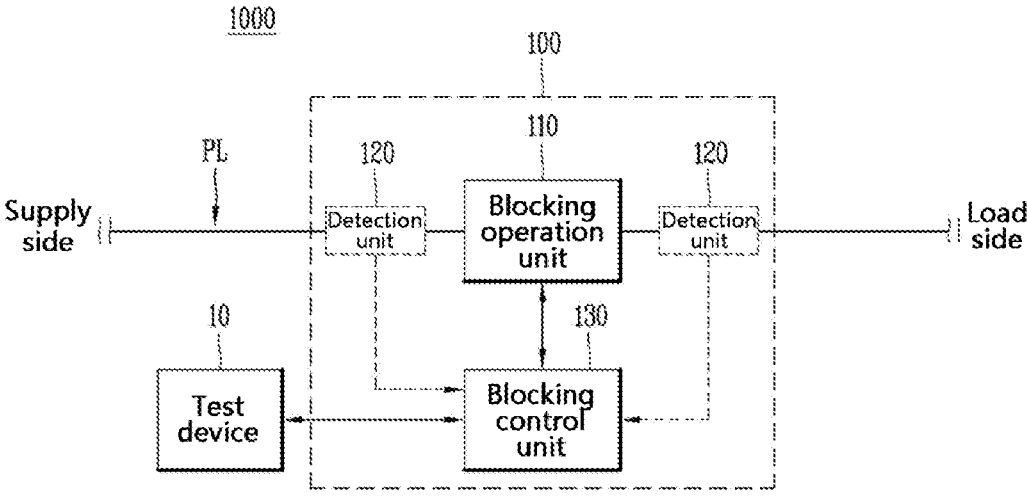
FIG. 3 is a block diagram of a circuit breaker test system according to an exemplary embodiment.

As illustrated in FIG. 3, the system 1000 includes a test device 10 and a circuit breaker 100.

The system 1000 refers to a system that tests the blocking operation of the circuit breaker 100 through the test device 10.

In the system 1000, the test device 10 communicates with the circuit breaker 100 in a data communication manner to generate data on information of a test signal for testing the blocking operation of the circuit breaker 100 and transmit the same to the circuit breaker 100, and the circuit breaker 100 receives the data from the test device 10, analyzes a relay element of the test signal on the basis of the data, and determines whether to perform the blocking operation according to an analysis result to operate according to a determination result.

Herein, the data may refer to data including at least one information of the test signal.

For example, it may be sampling data obtained by sampling the test signal.

Alternatively, it may be information data including information on at least one of the type, waveform, magnitude and harmonics of the test signal.

The test device 10 means a device for testing and inspecting the blocking operation of the circuit breaker 100.

The test device 10 may be a device that is connected to the circuit breaker 100 and transmits data for the testing and inspection to the circuit breaker 100 during the testing and inspection of the blocking operation.

The test device 10 may be a test device that transmits data on the blocking operation to the circuit breaker 100 to cause the circuit breaker 100 to perform a blocking operation.

The circuit breaker 100 refers to a protection device which is installed in a circuit PL through which a current flows, detects at least one of an abnormal current and an abnormal current generated in the circuit PL, and protects the circuit PL according to a detection result.

The circuit breaker 100 is a circuit breaker used in the distribution system, and it may be a circuit breaker that protects the system and device from accidents and failures occurring in the distribution system.

The circuit breaker 100 may be a circuit breaker which is installed in a switchboard.

An example of the breaker 100 may be an air circuit breaker (ACB) which is installed in a switchboard.

The circuit breaker 100 may be a circuit breaker that is installed on a switchboard and connects or disconnects a circuit PL between a supply side for supplying electric power and a load side for supplying the electric power.

The circuit breaker 100 as described above includes a blocking operation unit 110, a detection unit 120 and a blocking control unit 130.

In the circuit breaker 100, the blocking operation may be performed by the blocking control unit 130 controlling the blocking operation unit 110.

Herein, the blocking control unit 130 refers to a device that controls the execution of the blocking operation by performing signal/data processing and calculation for performing the operation of the circuit breaker 100.

That is, the blocking control unit 130 may be a control device 130 of the circuit breaker 100.

Hereinafter, the exemplary embodiments of the control device 130, the circuit breaker 100 and the system 1000 will be classified and described in order, but parts with overlapping descriptions will be omitted as much as possible to describe each exemplary embodiment.

Circuit Breaker Control Device

The control device 130 may be a microcontroller (MCU; Micro Control Unit) of the circuit breaker 100.

The control device 130 may be in the form of a module, and may be included in the circuit breaker 100.

Figure 4A:
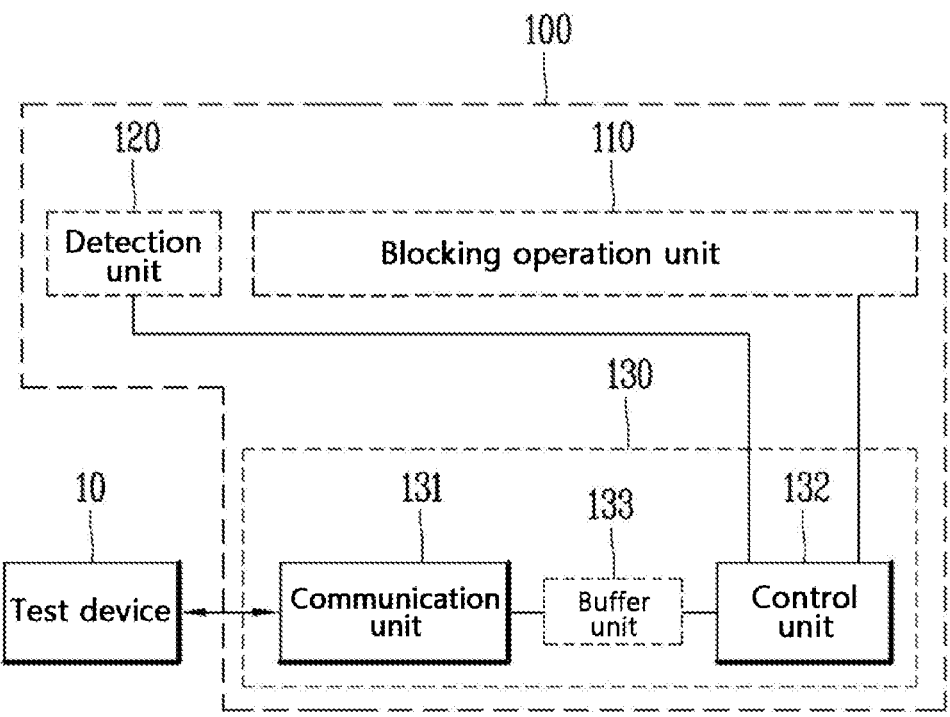
FIG. 4a is a block diagram 1 of a circuit breaker and a control device of the circuit breaker according to an exemplary embodiment.
Figure 5A:
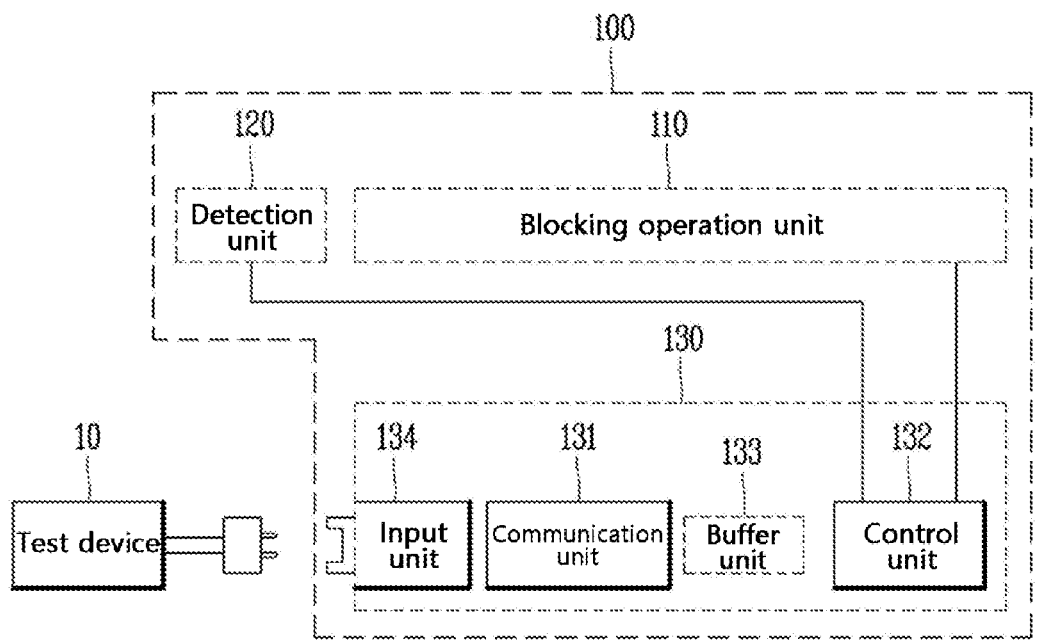
FIG. 5a is a configuration diagram 2 of a circuit breaker and a control device of the circuit breaker according to an exemplary embodiment.

A first example of the control device 130 may be as illustrated in FIG. 4a, and a second example thereof may be as illustrated in FIG. 5a.

The first example of the control device 130 is as follows.

As illustrated in FIG. 4a, the control device 130 includes a communication unit 131 which communicates with the test device 10 in a wireless communication manner and receives data about information of a test signal for testing the blocking operation of the circuit breaker from the test device 10, and a control unit 132 that analyzes relay elements of the test signal on the basis of the data, determines whether to perform the blocking operation according to an analysis result, and controls the execution of the blocking operation according to a determination result.

That is, the control device 130 may transmit and receive data while the communication unit 131 communicates with the test device 10 in a wireless communication manner.

Herein, the wireless communication manner may refer to a communication manner in which data is transmitted/received wirelessly.

The wireless communication manner is a communication manner that communicates information such as signals, codes, images and voices through radio waves instead of through wires, and it may be performed in various ways such as WIBRO, High Speed Downlink Packet Access (HSDPA)/WCDMA, Zigbee, Ultra Wide band (UWB), Wireless Fidelity (Wi-Fi), World Interoperability for Microwave Access (WiMAX), Infrared Data Association (IRDA), Radio Frequency (RF), Bluetooth, Mobile Computing, Trunked Radio System (TRS) and IEEE1 394, in addition to a communication manner of mobile communication service applied to the terminal The test device 10 may include a wireless communication module of any one of these wireless communication manners, and the communication unit 131 may be a wireless communication module which is capable of transmitting and receiving data by performing wireless communication with a wireless communication module included in the test device 10.

The communication unit 131 may transmit a notification signal for communication connection with the test device 10 to the control unit 132 when communication with the test device is established.

Herein, the notification signal may be a signal for notifying that the test of the blocking operation is performed according to the communication connection with the test device 10.

That is, when a wireless communication connection with the test device 10 is established, the communication unit 131 transmits the notification signal to the control unit 132 such that the control unit 132 may perform the control for the testing of the blocking operation.

The control unit 132 performs the operation control of the circuit breaker 100 in a first control mode until communication connection with the test device 10 is established, and when the notification signal is received from the communication unit 131, the first control mode is switched to a second control mode for testing the blocking operation such that the operation control of the circuit breaker 100 may be performed in the second control mode.

Herein, the first control mode is a mode for receiving detection data from the detection unit 120 included in the circuit breaker 100 and controlling the execution of the blocking operation according to the detection data, and the second control mode may be a mode for controlling the execution of the blocking operation according to the data.

That is, the first control mode may be a mode in which the detection unit 120 controls the general operation of the circuit breaker 100 according to the detection data detected from the circuit PL, and the second control mode may be a mode for controlling the test operation of the circuit breaker 100 according to the data received from the test device 10.

Accordingly, before the test device 10 establishes a communication connection with the communication unit 131, that is, during the general operation of the circuit breaker 100, the control unit 132 controls the operation of the circuit breaker 100 in the first control mode, and after the test device 10 establishes a communication connection with the communication unit 131, that is, from the time point at which the test operation of the circuit breaker 100 is performed, the control unit may control the operation of the circuit breaker 100 in the second control mode.

The control device 130 may further include a buffer unit 133 that receives the data from the communication unit 131, stabilizes the same and transmits the data to the control unit 132.

The buffer unit 133 may refer to a buffer for preventing a delay in data transmission due to a delay in a wireless communication speed between the test device 10 and the communication unit 131.

The buffer unit 133 may receive the entire data from the communication unit 131, and then transmit the entire data to the control unit 132.

Accordingly, the data may be accurately transmitted to control unit 132.

After receiving the data, the control unit 132 may determine information about the prototype of a test signal from the data.

For example, when the data is sampling data, after the control unit 132 receives the sampling data, the control unit 132 restores the sampling data or performs a restoration calculation on the sampling data to determine information on the prototype of the test signal.

The control unit 132 may determine signal information on at least one of the type, waveform, magnitude and harmonics of the test signal by using the data, and compare the signal information with a preset relay criterion to analyze the relay element.

Herein, the relay criterion may mean a criterion for the circuit breaker 100 to perform a blocking operation, and the relay element may mean an element for the circuit breaker 100 to perform a blocking operation.

The relay criterion may be, for example, a case in which the magnitude of the current is greater than or equal to a predetermined value, a case in which the current waveform is not of a specific shape, or a case in which the instantaneous peak value of a voltage is greater than or equal to a predetermined value.

The control unit 132 may determine that the circuit breaker 100 performs the blocking operation when the signal information corresponds to the relay criterion.

That is, when the signal information corresponds to the relay criterion, the control unit 132 determines that a relay element is included in the test signal, and thus, the circuit breaker 100 needs to perform a blocking operation, so as to determine to perform the blocking operation.

Figure 4B:
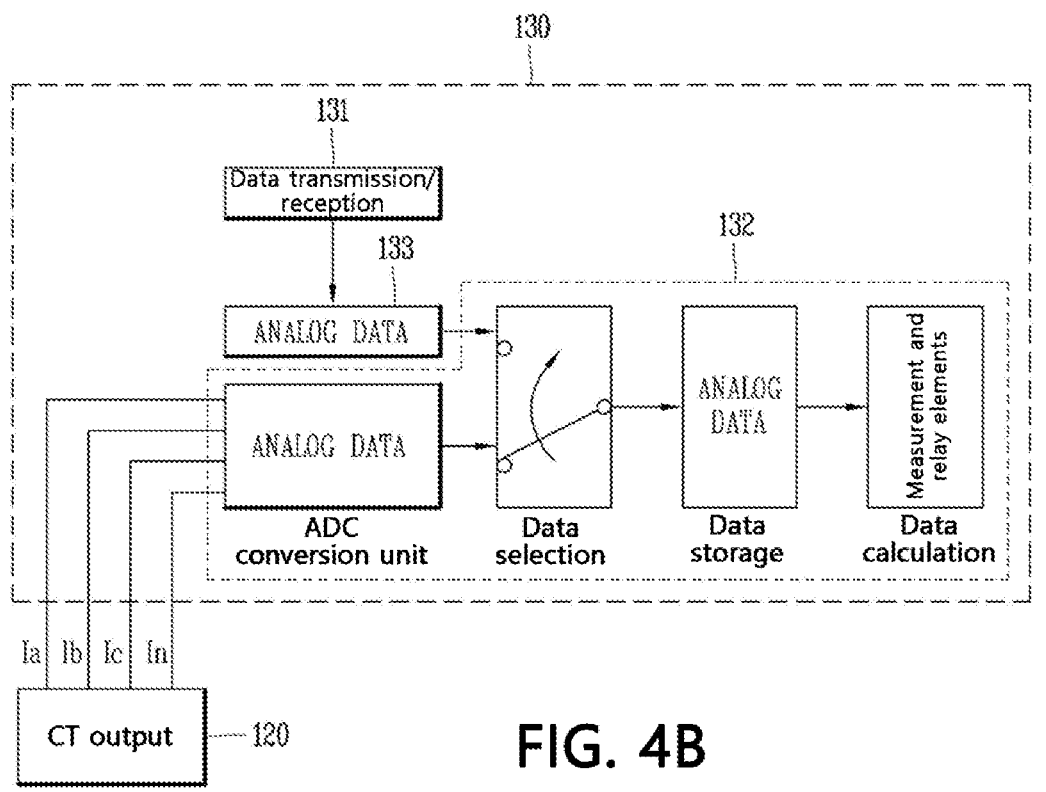

The block of a specific data processing process of the control device 130 may be as illustrated in FIG. 4b.

While the communication unit 131 controls the general operation of the circuit breaker 100 in the first control mode before being connected to the test device 10 by wireless communication, the control unit 132 receives a CT output of the detection unit 120, converts the same to ADC, generates the detection data, stores the detection data, analyzes the relay elements of the detection data, and determines whether to perform the blocking operation according to an analysis result, thereby controlling the operation of the circuit breaker 100, and when the communication unit 131 is wirelessly connected to the test device 10 to receive the data, the control unit 132 receives the notification signal from the communication unit 131 to switch the first control mode to the second control mode to select the reception of the data, stores the data and then analyzes relay elements of the data, and determines whether to perform the blocking operation according to an analysis result, thereby controlling the operation of the circuit breaker 100.

Meanwhile, the second example of the control device 130 is as follows.

As illustrated in FIG. 5a, the control device 130 includes an input unit 134 which is connected to a communication cable of the test device 10, a communication unit 131 for communicating with the test device 10 through a wired communication manner through the input unit 134 and receiving sampling data of a test signal for testing the blocking operation of the circuit breaker 100 from the test device 10, and a control unit 132 for analyzing relay elements of the test signal on the basis of the sampling data, determining whether to perform the blocking operation according to an analysis result, and controlling the execution of the blocking operation according to a determination result.

That is, the control device 130 may transmit and receive data while the communication unit 131 communicates with the test device 10 in a wired communication manner.

Herein, the wired communication manner may mean a communication manner in which data is transmitted and received by wire.

It may refer to a communication manner in which data is transmitted and received between two points through a wired transmission path.

The wired communication manner is a communication manner in which data is transmitted and received between two points through a wired cable, and it may be performed through various methods such as the Public Switching Data Network (PSDN), Integrated Services Digital Network (ISDN), Asymmetric Digital Subscriber Line (ADSL), Very-High-data rate Digital Subscriber Line), Ethernet and Power Line Communication (PLC).

The test device 10 may include a wired communication module of any one of the above-described wired communication manners, and the communication unit 131 may be a wired communication module which is capable of transmitting and receiving data by communicating with a wired communication module included in the test device 10 by wire.

The communication cable of the test device 10 may be a data transmission/reception cable.

The communication cable, including a connector tuck, may be communication-connected to the input unit 134 through the connector by wire.

In the communication cable, the connector which is connected to the input unit 134 may be formed with four or less pins.

Herein, the pin of the connector may consist of pins through which data is transmitted/received.

That is, the connector may be formed as a data transmission/reception pin except for a pin through which voltage or current is transmitted.

The communication unit 131 may transmit a notification signal for communication connection with the test device 10 to the control unit 132 when communication with the test device is established.

Herein, the notification signal may be a signal for notifying that the test of the blocking operation is performed according to the communication connection with the test device 10.

That is, when the wired cable of the test device 10 is connected to the input unit 134, the communication unit 131 transmits the notification signal to the control unit 132 such that the control unit 132 performs control for testing the blocking operation.

The control unit 132 performs the operation control of the circuit breaker 100 in the first control mode until communication connection with the test device 10 is established, and when the notification signal is received from the communication unit 131, the first control mode is switched to a second control mode for testing the blocking operation, so as to perform operation control of the circuit breaker 100 in the second control mode.

Herein, the first control mode may be a mode for receiving detection data from the detection unit 120 included in the circuit breaker 100 and controlling the execution of the blocking operation according to the detection data, and the second control mode may be a mode for controlling the execution of the blocking operation according to the sampling data.

That is, the first control mode may be a mode in which the detection unit 120 controls the general operation of the circuit breaker 100 according to the detection data detected from the circuit PL, and the second control mode may be a mode for controlling the test operation of the circuit breaker 100 according to the sampling data received from the test device 10.

Accordingly, before the test device 10 establishes a communication connection with the communication unit 131, that is, during the general operation of the circuit breaker 100, the control unit 132 may control the operation of the circuit breaker 100 in the first control mode, and after the test device 10 establishes a communication connection with the communication unit 131, that is, from the time point at which the test operation of the circuit breaker 100 is performed, the control unit 132 may control the operation of the circuit breaker 100 in the second control mode.

The control device 130 may further include a buffer unit 133 that receives the sampling data from the communication unit 131, stabilizes the same and transmits the same to the control unit 132.

The buffer unit 133 may receive all of the sampling data from the communication unit 131, and then transmit all of the sampling data to the control unit 132.

Accordingly, the sampling data may be accurately transmitted to the control unit 132.

The control unit 132 may determine signal information on at least one of the type, waveform, magnitude and harmonics of the test signal by using the sampling data, and compare the signal information with a preset relay criterion to analyze the relay element.

The control unit 132 may determine that the circuit breaker 100 performs the blocking operation when the signal information corresponds to the relay criterion.

That is, when the signal information corresponds to the relay criterion, the control unit 132 determines that a relay element is included in the test signal and thus the circuit breaker 100 needs to perform a blocking operation, so as to determine to perform the blocking operation.

Figure 5B:
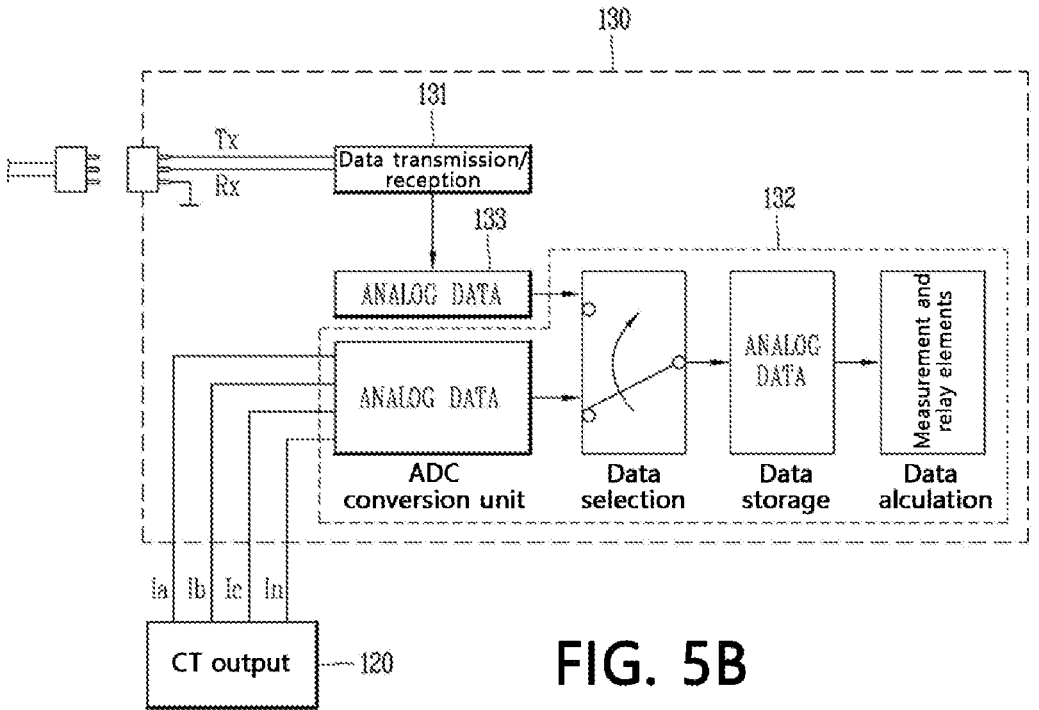

A block of the specific data processing process of the control device 130 may be as illustrated in FIG. 5*b*.

While the communication unit 131 controls the general operation of the circuit breaker 100 in the first control mode before being connected to the test device 10 through wired communication, the control unit 132 may receive a CT output of the detection unit 120, convert the same to ADC, generate the detection data, store the detection data, analyze relay elements of the detection data, determine whether to perform the blocking operation according to an analysis result to control the operation of the circuit breaker 100, and when the communication unit 131 is connected to the test device 10 through wired communication through the input unit 134 and receives the sampling data, the control unit 132 may receive the notification signal from the communication unit 131, switch the first control mode to the second control mode, select reception of the sampling data, store the sampling data, analyze relay elements of the sampling data, and determine whether to perform the blocking operation according to an analysis result to control the operation of the circuit breaker 100.

Circuit Breaker

As illustrated in FIG. 3, the circuit breaker 100 includes the blocking operation unit 110 for connecting or disconnecting a circuit PL between a supply side for supplying electric power and a load side for receiving the electric power; the detection unit 120 for detecting at least one of a current and a voltage of the circuit PL; and the blocking control unit 130 for determining whether to perform the blocking operation depending on a detection result of the detection unit 120, or receiving sampling data of a test signal for testing a blocking operation of the circuit breaker 100 from the test device by communicating with the test device 10 in a data communication manner, and analyzing relay elements of the test signal on the basis of the sampling data to determine whether to perform the blocking operation on the basis of an analysis result to control the blocking operation unit 110 according to a determination result.

The blocking operation unit 110 may refer to an opening/closing means that is operated under the control of the blocking control unit 130.

The blocking operation unit 110 may operate according to a control signal generated by the blocking control unit 130.

The blocking operation unit 110 is closed to connect the circuit PL before the relay element is generated in the circuit PL or until the relay element of the test signal is analyzed, and when the relay element is generated in the circuit PL or the relay element of the test signal is analyzed, it is opened to separate the circuit PL.

The detection unit 120 may refer to a detection means for detecting at least one of a current and a voltage in the circuit PL.

The detection unit 120 may be installed at a front or rear end of the blocking operation unit 110, detect at least one of a current and a voltage of the circuit PL, and transmit a detection result to the blocking control unit 130.

The blocking control unit 130 may include the communication unit which is communicatively connected with the test device 10 to transmit or receive data, the control unit 132 for generating a control signal for controlling the blocking operation unit 110 to transmit to the blocking operation unit, and the buffer unit 133 for receiving all of the sampling data from the communication unit 131 to stabilize the same to transmit to the control unit 132.

That is, the blocking control unit 130 may be the control device 130 described above.

The blocking control unit 130 may be wirelessly connected to the test device 10 to transmit and receive data.

In this case, the blocking control unit 103 includes the communication unit 131 and the control unit 132 as illustrated in FIG. 4*a* such that the communication unit 131 is connected to the test device 10 in a wireless communication manner, and the control unit 132 may process data in the process as illustrated in FIG. 4*b* and control the blocking operation unit 110.

The blocking control unit 130 may also be connected to the test device 10 by wire to transmit and receive data.

When the blocking control unit 130 is connected to the test device 10 by wire, the communication cable of the test device 10 may be connected to the input unit 134 so as to be connected to the test device 10 by wire.

In this case, as illustrated in FIG. 5*a*, the blocking control unit 103 includes the communication unit 131, the control unit 132 and the input unit 134 such that the communication unit 131 may be connected to the test device 10 through the input unit in a wired communication manner, and the control unit 132 may process data in the process shown in FIG. 5*b* and control the blocking operation unit 110.

The blocking control unit 130 controls the blocking operation unit 110 by determining whether to perform the blocking operation according to the detection result before communication connection with the test device 10 is established, and when communication connection with the test device 10 is established, the blocking control unit 130 may control the blocking operation unit 110 by determining whether to perform the blocking operation according to the analysis result.

The blocking control unit 130 may determine signal information on at least one of the type, waveform, magnitude and harmonics of the test signal by using the sampling data, and compare the signal information with a preset relay criterion to analyze the relay elements.

When the signal information corresponds to the relay criterion, the blocking control unit 130 may determine to perform the blocking operation.

That is, when the signal information corresponds to the relay criterion, the blocking control unit 130 may determine that a relay element is included in the test signal and thus the circuit breaker 100 needs to perform a blocking operation, so as to determine to perform the blocking operation.

Figure 6:
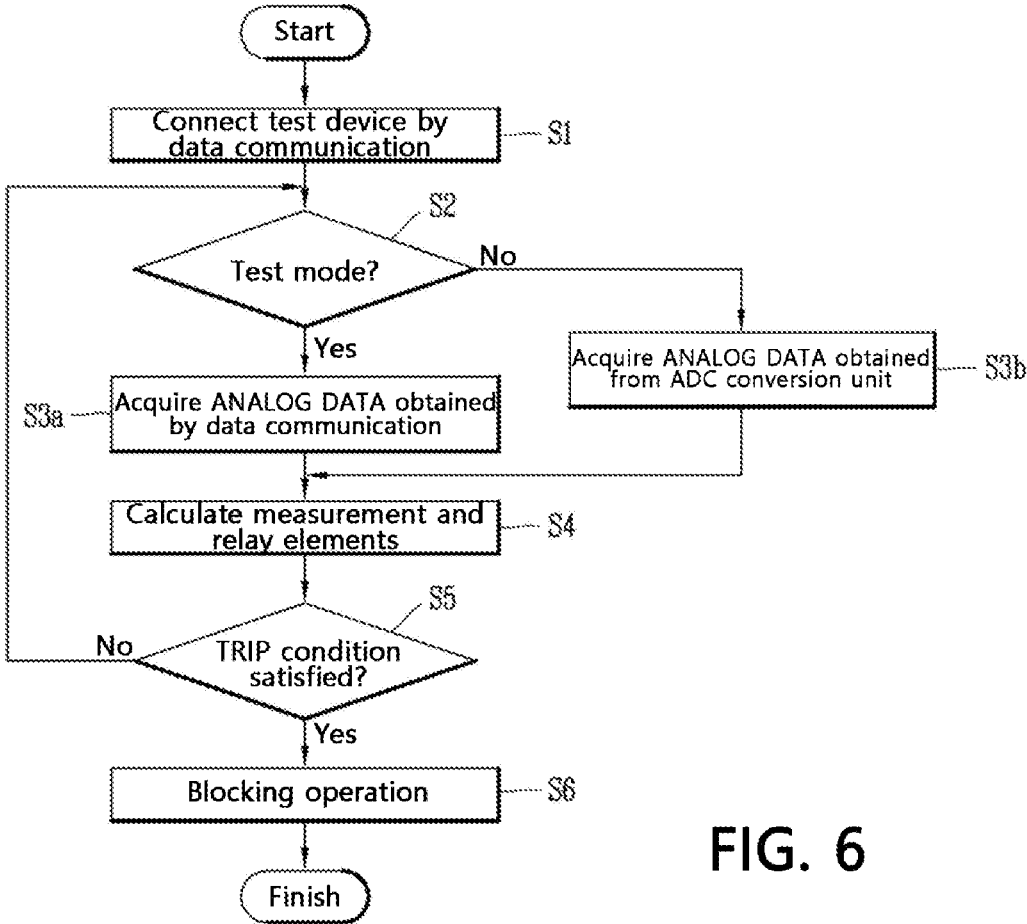
FIG. 6 is a flowchart showing the blocking operation process of a circuit breaker according to an exemplary embodiment.

The blocking operation process of the circuit breaker 100 may be as shown in FIG. 6.

When the blocking control unit 130 establishes a communication connection with the test device 10 in a data communication manner (S1), it checks whether the current operation mode is a test mode or a normal mode (S2), and if it is in the test mode, it receives the sampling data which is analog data from the test device 10 (S3*a*), and performs the measurement of the sampling data and the calculation of relay elements (S4), and if it is in the normal mode, it receives the detection data which is is analog data from the detection unit 120 (S3*b*), performs the measurement of the detection data and the calculation of relay elements (S4), and checks whether the calculation result satisfies the blocking operation condition (Trip condition) (S5), and if the blocking operation condition is satisfied, it performs the blocking operation (S6), and if the blocking operation condition is not satisfied, it does not perform the blocking operation to maintain the current state (repeat S2 to S5).

Circuit Breaker Test System

As illustrated in FIG. 3, the system 1000 includes the test device 10 for communicating with the circuit breaker 100 in a data communication manner to generate sampling data of a test signal for testing the blocking operation of the circuit breaker 100 and transmit the same to the circuit breaker 100; and the circuit breaker 100 for receiving the sampling data from the test device 10, analyzing relay elements of the test signal on the basis of the sampling data, determining whether to perform the blocking operation according to an analysis result, and operating according to a determination result.

The test device 10 may generate the sampling data by sampling the test signal according to a predetermined criterion.

Herein, the predetermined criterion may be a criterion that can be transmitted without including harmonics, when the test signal is sampled and transmitted to the circuit breaker 100.

The test device 10 may generate the sampling data by sampling the test signal at 128 [Bit].

That is, the sampling data may be data obtained by sampling the test signal at 128 [bit], and may be transmitted to the circuit breaker 100 at 128 [bit].

As such, since the test signal is sampled at 128 [bit], when the breaker 100 receives and analyzes the sampling data, the relay element may be analyzed close to the prototype of the test signal without including harmonics.

When a setting input for setting the pattern of the test signal is input, the test device 10 may generate the test signal according to the setting input, and may generate the sampling data by sampling the test signal.

Herein, the setting input may be an input signal for setting at least one of the type, waveform, magnitude and harmonics of the test signal.

That is, the test device 10 may generate the test signal according to the input signal.

The setting input may be input through an input means which is formed outside the test device 10, and the input signal may be generated in response to the setting input.

For example, when a voltage test button is formed in the test device 10, when the voltage test button is pushed, an input signal is generated in response to the push of the voltage test button, and the test signal may be generated as a voltage signal according to the input signal.

Alternatively, when an input screen for setting the waveform and size of the test signal is formed in the test device 10, an input signal is generated corresponding to the waveform and size setting value that are input to the input screen, and according to the input signal, the test signal may be generated with a preset input waveform and magnitude.

Accordingly, the test device 10 may generate the test signal in various forms.

In addition, as the test device 10 and the circuit breaker 100 transmit and receive data in a data communication manner, the test device 10 transmits the test signals generated in various forms to the circuit breaker 100 as a sampling result, and accordingly, it is possible to perform various tests according to various signal types.

Figure 7A:
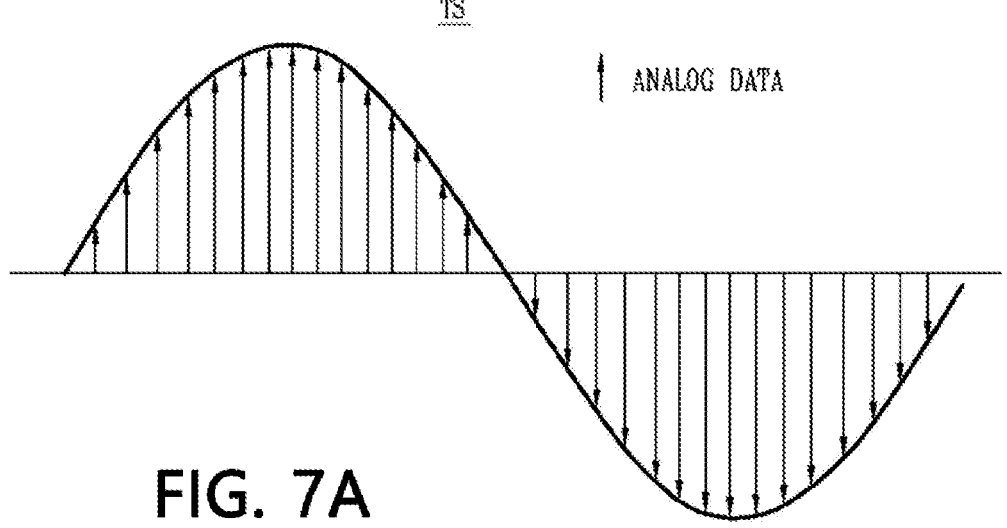
FIG. 7a is an exemplary diagram a showing an example of a test signal and sampling data according to an exemplary embodiment.
Figure 7B:
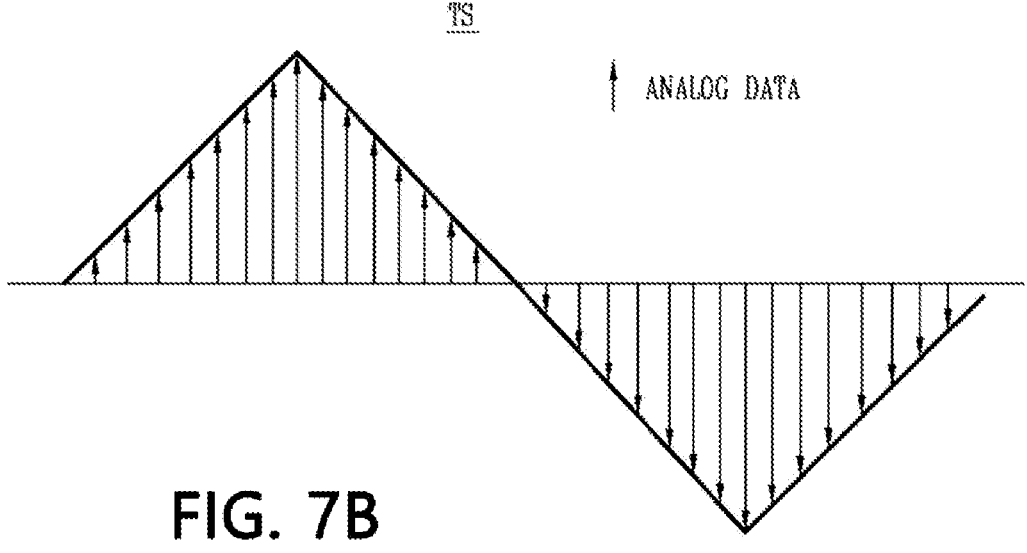
FIG. 7b is an exemplary diagram b showing an example of a test signal and sampling data according to an exemplary embodiment.
Figure 7C:
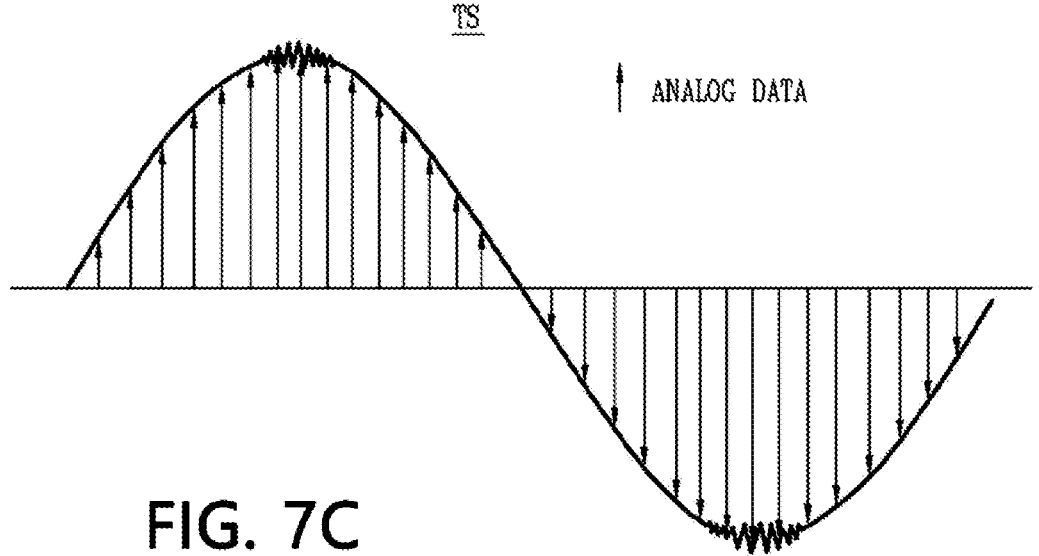
FIG. 7c is an exemplary diagram c showing an example of a test signal and sampling data according to an exemplary embodiment.
Figure 7D:
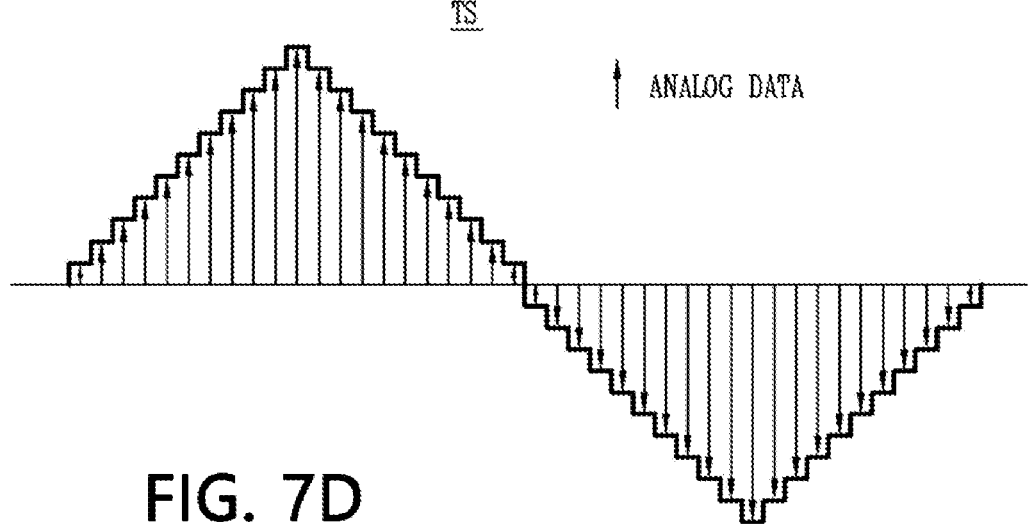
FIG. 7d is an exemplary diagram d showing an example of a test signal and sampling data according to an exemplary embodiment.

For example, as illustrated in FIG. 7a, a sine wave test signal TS may be generated and tested accordingly, and as illustrated in FIG. 7b, a triangular wave test signal TS may be generated and tested accordingly, and as illustrated in FIG. 7c, a test signal TS including harmonics may be generated and tested accordingly, and a test signal TS having the form illustrated in FIG. 7d may be generated and tested accordingly.

The test device 10 and the circuit breaker 100 may be wirelessly connected to each other.

The test device 10 and the circuit breaker 100 may also be connected through wire communication by connecting a communication cable of the test device 10 to an input unit 134 of the circuit breaker 100.

The circuit breaker 100 may include the blocking operation unit 110 for connecting or disconnecting a circuit between a supply side for supplying electric power and a load side for receiving the electric power; the detection unit 120 for detecting at least one of a current and a voltage of the circuit; and the blocking control unit 110 for determining whether to perform the blocking operation depending on a detection result of the detection unit 120, or determining whether to perform the blocking operation on the basis of the sampling data received from the test device 10 to control the blocking operation unit 110 according to a determination result.

That is, the circuit breaker 100 may be the circuit breaker 100 described above.

The blocking control unit 130 may include the communication unit 131 which is communicatively connected to the test device 10 to transmit and receive data; the control unit 132 for generating a control signal for controlling the blocking operation unit 110 and transmitting the same to the blocking operation unit 110; and the buffer unit 133 for receiving and stabilizing all of the sampling data from the communication unit 131 and transmits the same to the control unit 132.

That is, the blocking control unit 130 may be the control device 130 described above.

The circuit breaker 100 may receive detection data from the detection unit 120 until a communication connection is established with the test device 10, and perform the blocking operation according to the detection data, and when a communication connection is established with the test device 10, the blocking operation may be performed according to the sampling data.

Figure 8:
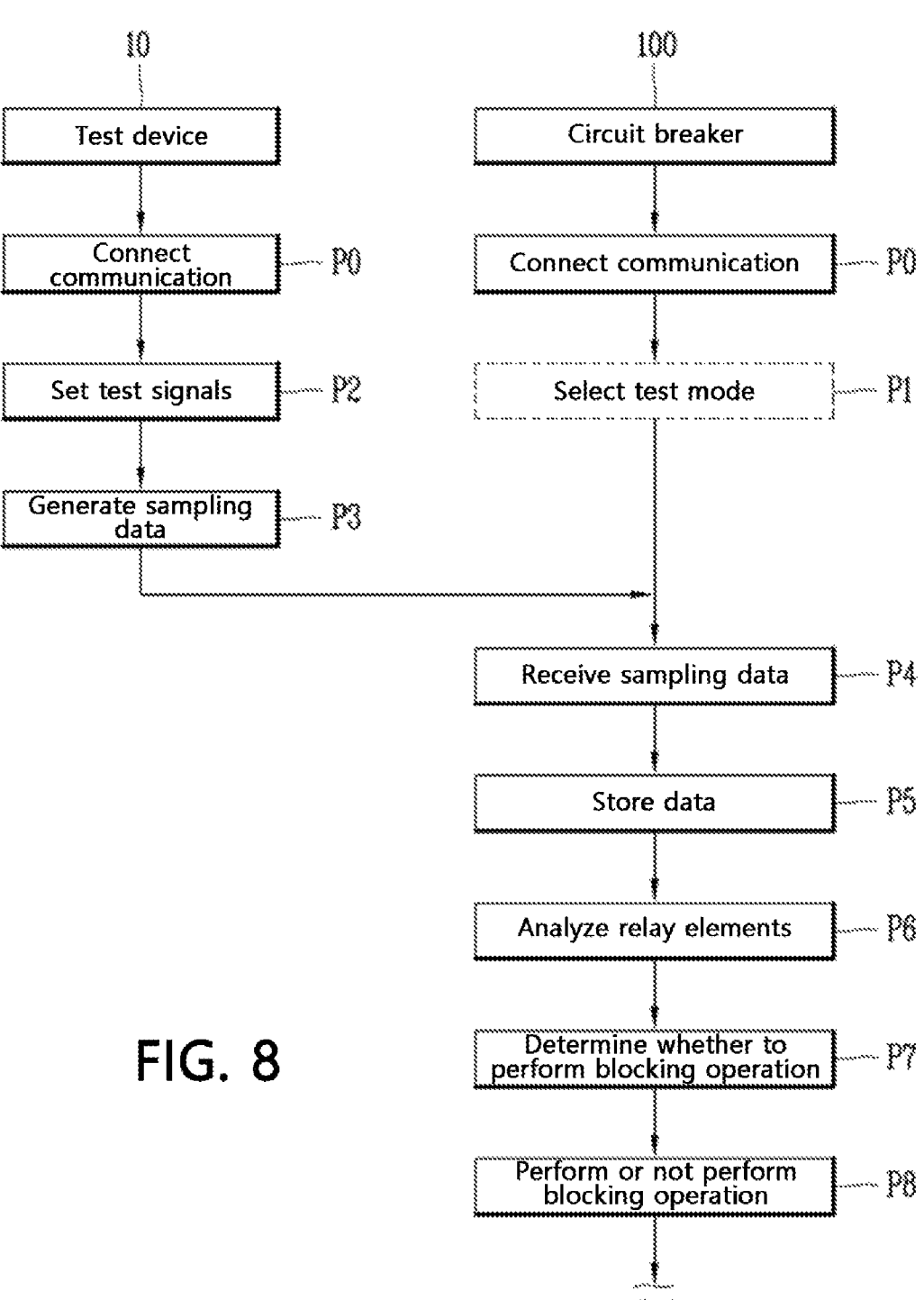
FIG. 8 is a flowchart showing a process in which the blocking operation test is performed in a circuit breaker test system according to an exemplary embodiment.

As such, the process in which a blocking operation test is performed in the system 1000 including the test device 10 and the circuit breaker 100 may be as illustrated in FIG. 8.

When the test device 10 and the circuit breaker 100 establish communication with each other in a data communication manner (P0), a test mode for testing the blocking operation in the circuit breaker 100 is selected (P1), and the test signal may be set in the test device 10 (P2).

According to the setting, when the test device 10 generates the test signal and then samples the same, the sampled data is generated (P3) and transmitted to the circuit breaker 100, and after the circuit breaker 100 receives the sampling data (P4) and stores the same (P5), the relay element of the sampling data may be analyzed (P6).

After the circuit breaker 100 analyzes relay elements of the sampling data (P6), it is determined whether to perform the blocking operation according to the analysis result (P7), and when the relay element is included in the test signal, it determines to perform the blocking operation, and when the relay element is not included in the test signal, it determines not to perform the blocking operation (P7), and thus, the blocking operation may be performed or not performed according to a determination result (P8).

The exemplary embodiments described above are disclosed to solve the technical problems, and various modifications, changes, additions and the like will be possible within the spirit and scope of the present disclosure by one of ordinary skill in the art (a person skilled in the art) to which the present disclosure pertains, and such modifications and the like must be regarded as belonging to the scope of the following claims.

In addition, each exemplary embodiment may be implemented in combination with one or more, and each exemplary embodiment may also be implemented independently.

10: Test device
100: Circuit breaker
110: Blocking operation unit
120: Detection unit
130: Blocking control unit (control device)
131: Communication unit
132: Control unit
133: Buffer unit
134: Input unit
1000: Circuit breaker test system

The invention claimed is:

1. A circuit breaker control device, comprising:
a communication unit in which communication is performed with an external test device in a data communication manner so as to receive, from the external test device, data on information of a test signal for testing a blocking operation of the circuit breaker; and
a control unit in which a relay element of the test signal is analyzed on the basis of the data, and it is determined whether to perform the blocking operation according to an analysis result, and the blocking operation is thus performed according to a determination result,
wherein the data is sampling data in which the test signal is sampled at 128 [Bit] by the external testing device.

2. The circuit breaker control device of claim 1, wherein the communication unit transmits a notification signal about a communication connection with the external test device to the control unit when communication with the external test device is established.

3. The circuit breaker control device of claim 2, wherein the control unit controls the operation of the circuit breaker in a first control mode until communication is established with the external test device, and when the notification signal is received from the communication unit, the first control mode is switched to a second control mode for testing the blocking operation, and the control unit controls the operation of the circuit breaker in the second control mode.

4. The circuit breaker control device of claim 3, wherein the first control mode is a mode for receiving detection data from a detection unit included in the circuit breaker and controlling the execution of the blocking operation according to the detection data, and
wherein the second control mode is a mode for controlling the execution of the blocking operation according to the data.

5. The circuit breaker control device of claim 1, further comprising:
a buffer unit for receiving and stabilizing the data from the communication unit and transferring the data to the control unit.

6. The circuit breaker control device of claim 5, wherein after receiving the entire data from the communication unit, the buffer unit transfers the entire data to the control unit.

7. The circuit breaker control device of claim 1, wherein the control unit determines signal information on at least one of the type, waveform, magnitude and harmonics of the test signal by using the data, and analyzes the relay element by comparing the signal information with a preset relay criterion.

8. A circuit breaker which is installed in a switchboard, comprising:

a blocking operation unit for connecting or disconnecting a circuit between a supply side for supplying electric power and a load side for receiving the electric power;

a detection unit for detecting at least one of a current and a voltage of the circuit; and a blocking control unit for determining whether to perform the blocking operation depending on a detection result of the detection unit, or communicating with an external test device in a data communication manner to receive sampling data of a test signal for testing a blocking operation of the circuit breaker from the external test device, and analyzing a relay element of the test signal on the basis of the sampling data to determine whether to perform the blocking operation according to an analysis result to control the blocking operation unit according to a determination result, and wherein the external test device generates the sampling data by sampling the test signal at 128 [Bit].

9. The circuit breaker of claim 8, wherein the blocking control unit is wirelessly connected to the external test device to transmit and receive data.

10. The circuit breaker of claim 8, wherein the blocking control unit transmits and receives data by connecting the communication cable of the external test device to the input unit and communicating with the external test device by wire, and wherein the communication cable is a cable for transmitting and receiving data in which a connector connected to the input unit is formed of 4 or less pins.

11. The circuit breaker of claim 8, wherein the blocking control unit controls the blocking operation unit by determining whether to perform the blocking operation according to the detection result until the communication connection with the external test device is established, and when the communication connection with the external test device is established, the blocking control unit determines whether to perform the blocking operation according to the analysis result and to control the blocking operation unit.

12. A circuit breaker test system, comprising:

a test device for communicating with a circuit breaker through a wireless data communication manner or a wired data communication manner through a connection of a communication cable to generate sampling data of a test signal for testing a blocking operation of the circuit breaker and transmit the sampling data to the circuit breaker; and a circuit breaker for receiving the sampling data from the test device, analyzing relay elements of the test signal on the basis of the sampling data, and determining whether to perform the blocking operation according to the analysis result to operate according to a determination result, and wherein the test device generates the sampling data by sampling the test signal at 128 [Bit].

13. The circuit breaker test system of claim 12, wherein when a setting input for setting the pattern of the test signal is input, the test device generates the test signal according to the setting input, and generates the sampling data by sampling the test signal.

14. The circuit breaker test system of claim 13, wherein the setting input is an input signal for setting at least one of the type, waveform, magnitude and harmonics of the test signal.

\* \* \* \* \*